United States Patent
Thomas et al.

(10) Patent No.: US 8,018,370 B2
(45) Date of Patent: Sep. 13, 2011

(54) TIME-MULTIPLEXED RESIDUE AMPLIFIER

(75) Inventors: Andrew J. Thomas, Arlington, MA (US); Joseph L. Sousa, Lawrence, MA (US)

(73) Assignee: Linear Technology Corporation, Milpitas, CA (US)

(*) Notice: Subject to any disclaimer, the term of this patent is extended or adjusted under 35 U.S.C. 154(b) by 23 days.

(21) Appl. No.: 12/698,020

(22) Filed: Feb. 1, 2010

(65) Prior Publication Data

US 2011/0187573 A1    Aug. 4, 2011

(51) Int. Cl.
*H03M 1/34* (2006.01)

(52) U.S. Cl. ........ 341/162; 341/118; 341/120; 341/155; 341/161; 341/163

(58) Field of Classification Search .......... 341/118–121, 341/155, 161, 162, 163
See application file for complete search history.

(56) References Cited

U.S. PATENT DOCUMENTS

| | | | | |
|---|---|---|---|---|
| 5,394,148 | A * | 2/1995 | Matsuura et al. | 341/162 |
| 6,028,546 | A * | 2/2000 | Signell et al. | 341/161 |
| 6,323,800 | B1 * | 11/2001 | Chiang | 341/161 |
| 6,369,744 | B1 * | 4/2002 | Chuang | 341/161 |
| 6,839,009 | B1 * | 1/2005 | Ali | 341/118 |
| 7,339,512 | B2 * | 3/2008 | Gulati et al. | 341/172 |
| 7,551,115 | B2 * | 6/2009 | Bailey et al. | 341/161 |
| 7,570,191 | B2 * | 8/2009 | Easwaran et al. | 341/161 |
| 7,623,057 | B2 * | 11/2009 | Sakurai | 341/172 |
| 7,652,601 | B2 * | 1/2010 | Patterson et al. | 341/136 |
| 7,663,516 | B1 * | 2/2010 | Chandra | 341/120 |
| 2005/0174277 | A1 * | 8/2005 | Tani et al. | 341/156 |

OTHER PUBLICATIONS

European Search Report issued in European Patent Application No. 11000785.3-1233, mailed Apr. 6, 2011.
Hatanaka, S., et al., "A Ratio-Independent Algorithmic Pipeline Analog-to-Digital Converter", Electronics, Circuits and Systems 2001 ICECS The 8th IEEE International Conference on Sep. 2-5, 2001, Piscataway, NJ, pp. 345-348, vol. 1, IEEE.

* cited by examiner

*Primary Examiner* — Linh V Nguyen
(74) *Attorney, Agent, or Firm* — McDermott Will & Emery LLP (57) ABSTRACT

A system is configured and a method is provided for receiving an input ratio represented by a first input signal and a second input signal, and producing an output ratio represented by a first output signal and a second output signal. The system is constructed and the method is provided for alternately operating in at least two time periods, wherein in one time period the first input signal, a low accuracy amplifier, and the first output signal are selectively coupled, and in another time period the input signal, the low accuracy amplifier, a high accuracy attenuator, and the second output signal are selectively coupled so as to maintain the output ratio proportional to the input ratio.

82 Claims, 4 Drawing Sheets

TIME-MULTIPLEXED RESIDUE AMPLIFIER

FIELD

The disclosure relates generally to analog-to-digital converters, and more particularly to a multi-stage ADC including a time-multiplexed, residue amplifier.

BACKGROUND

High performance analog signal processing systems often operate on ratios of analog signals. Operating on such ratios offers these systems freedom from certain errors which relate to the absolute scale of the analog signal being processed. It is also often desirable to apply a known gain to at least one of the signals in a ratio, for example to allow processing of this signal with reduced or eliminated concern for error sources with fixed absolute scale, such as noise.

One common example of such a system is an analog-to-digital converter (ADC). The function of an ADC is to produce a digital output signal as a function of an analog input signal (for example a voltage) as it relates to a reference signal.

A known technique for accomplishing this function is to generate the digital output signal using a multi-stage ADC. Such an ADC includes at least one stage comprising an ADC of lower resolution than the overall converter resolution. The stage quantizes an analog input, and a digital-to-analog converter (DAC) produces an analog representation of the ADC output. An analog subtraction unit produces a residue signal. The residue signal is the difference between the analog input and the output of the DAC. The residue is then amplified and processed by additional, similarly constructed stages, the last of which produces the least significant bit, and may dispense with the DAC and subtraction unit.

Figure 1:
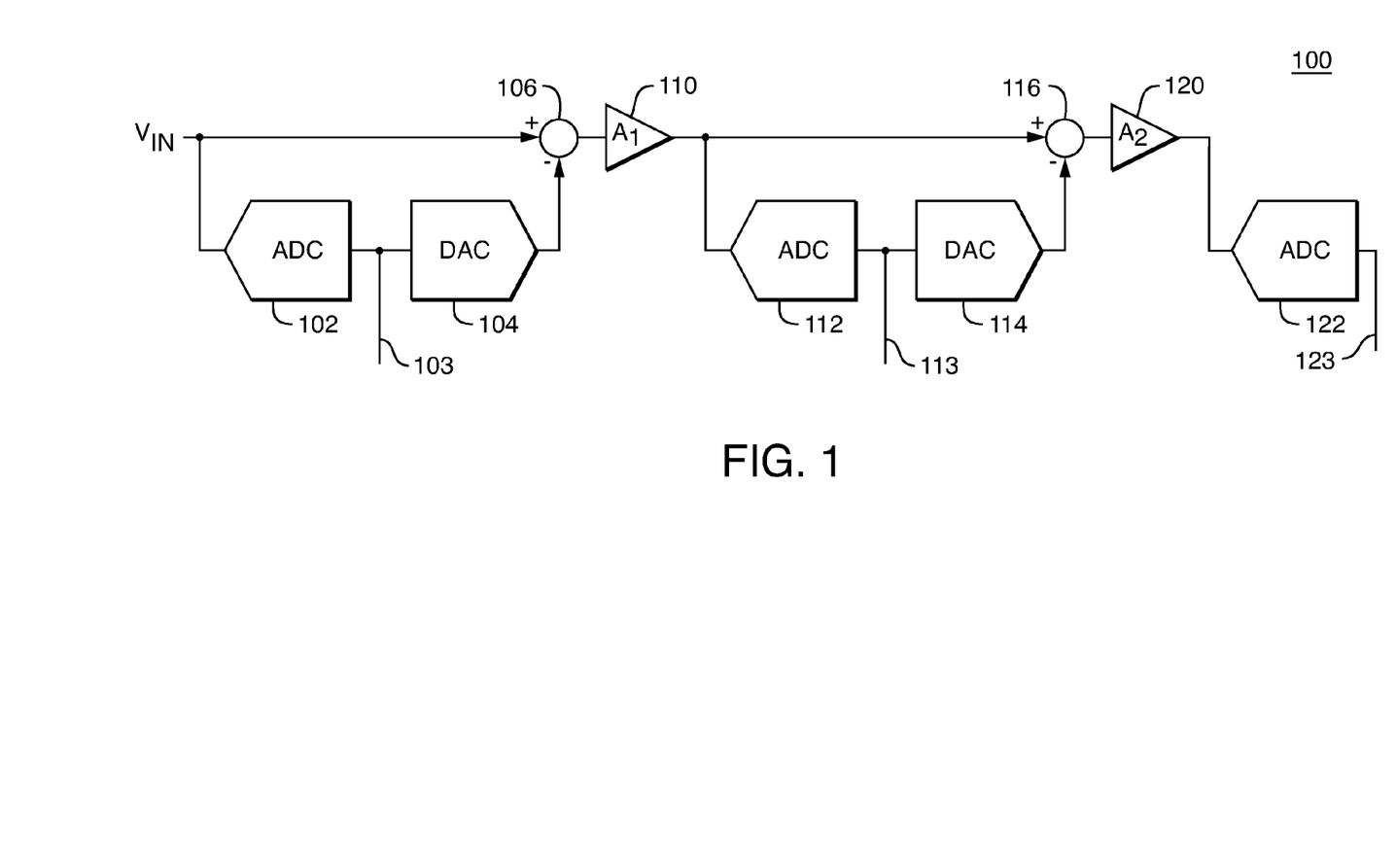
FIG. 1 is block diagram of a prior art multi-stage ADC.

An example of an application employing this technique is shown in block-diagram form as 100 in FIG. 1. The illustrated device is shown as a three stage converter. One stage includes ADC 102, DAC 102 and subtraction unit 106, while a second stage includes ADC 112, DAC 114, and subtraction 116. The last stage only includes ADC 122 since no residue unit is required. Interstage amplifiers 110 and 120 amplify the residues produced by the first stages prior to being presented to the next stage. The final converter result is produced by combining the individual ADC digital outputs 103, 113, and 123.

The multistage architecture offers the advantage that the individual ADCs and DACs may have dramatically coarser resolution than the overall converter resolution, resulting in a commensurate decrease in overall converter size and complexity, and therefore typically an increase in speed and decrease in power. Furthermore, the interstage amplifiers may incorporate sample-and-hold (S/H) circuitry to form a pipeline converter, which allows the first stage to begin processing an input sample while later stages are still occupied processing previous input sample(s).

While the multistage architecture reduces the resolution requirements of the components in each of the stages, the accuracy (including noise and linearity effects) requirements are more stringent. In particular, the residue presented to the second stage must be accurate to the full resolution of the converter, implying that DAC 104, subtractor 106 and amplifier 110 need to be similarly accurate in order to insure that the residue provided by one stage and applied to the next will not introduce errors going forward in the succession of stages.

This requirement necessitates tradeoffs in the design of the interstage amplifiers which tend to degrade system performance. The gain of the amplifiers ($A_1$ and $A_2$ respectively for amplifiers 110 and 120) is required to be accurate so that the relative weights of bits in all of the ADCs and DACs are well correlated with respect to the input signal and the reference signal. In practice, this leads to closed-loop solutions using operational amplifiers or similar circuits which derive their accuracy from feedback networks and high open-loop gains. The stability requirements of these closed-loop systems in turn limit the speed, noise, and power performance of the amplifiers, and thereby the ADC as a whole.

SUMMARY

The disclosure is directed to a system and method. In accordance with one aspect a system includes a circuit receiving an input ratio represented by a first input signal and a second input signal, and producing an output ratio represented by a first output signal and a second output signal. The circuit comprises: a low accuracy amplifier and a high accuracy attenuator. The circuit operates in at least two alternating time periods. In one time period the circuit selectively couples the first input signal, the low accuracy amplifier, and the first output signal. In another time period the circuit selectively couples the second input signal, the low accuracy amplifier, the high accuracy attenuator, and the second output signal. The circuit operates to maintain the output ratio substantially proportional to the input ratio.

In accordance with another aspect, the system is an analog to digital conversion system including a multi-stage circuit. The multi-stage circuit comprises: at least two stages each including a first signal path constructed to conduct at least a portion of an analog input signal, and a second signal path constructed to conduct at least a portion of an analog reference signal. The multi-stage circuit also includes at least one amplifier having a gain, an input and an output; and a time multiplexer constructed to operate alternately in at least two time periods, wherein: (a) during a first time period the first signal path of a first stage is connected to the input of the amplifier and the output of the amplifier is connected to the first signal path of a second stage, and (b) during a second time period the second signal path of a first stage is connected to the input of the amplifier and the output of the amplifier is connected to the second signal path of the second stage, wherein the analog input signal and analog reference signal are each amplified by the same gain as each is respectively transmitted from the first to the second stages during the first and second time periods.

In accordance with yet another aspect the system is a multi-stage analog to digital converter for converting an analog input signal to a digital output signal. The system comprises: a plurality of stages constructed and arranged so as to quantize the analog input signal by comparing the input signal in the first stage and a residue signal in each subsequent stage with a reference signal provided to each stage, and an interstage amplifier disposed between each set of interconnected stages and operative so as to apply the same amplifier gain to the residue and reference signals provided to the subsequent stage.

In accordance with another aspect, a method of (a) receiving an input ratio represented by a first input signal and a second input signal, and (b) producing an output ratio represented by a first output signal and a second output signal comprises alternately operating in at least two time periods. In one time period the first input signal, a low accuracy amplifier, and the first output signal are selectively coupled. In another time period the input signal, the low accuracy amplifier, a high accuracy attenuator, and the second output signal are selectively coupled so as to maintain the output ratio proportional to the input ratio.

In accordance with still another aspect, a method of converting an analog input signal to a digital output signal, comprises operating a time multiplexer alternately in at least two time periods, wherein (a) during a first time period connecting a first signal path of a first stage carrying an analog input signal to an input of an amplifier having a gain and connecting the output of the amplifier to a first signal path of a second stage, and (b) during a second time period connecting a second signal path of the first stage carrying an analog reference signal to the input of the amplifier and connecting the output of the amplifier to a second signal path of the second stage. The analog input signal and analog reference signal are each amplified by the same gain as each is respectively transmitted from the first to the second stages during the first and second time periods.

Finally, in accordance with yet another aspect, a method of converting an analog input signal to a digital output signal using a plurality of stages and an interstage amplifier disposed between each successive stage comprises: quantizing the analog input signal by comparing the input signal in the first stage and a residue signal in each subsequent stage with a reference signal provided to each stage, and applying the same amplifier gain to the residue and reference signals provided to the subsequent stage.

DETAILED DESCRIPTION OF THE DRAWINGS

The system described herein accomplishes the function of applying gain proportionally to both signals of an input ratio, thereby relaxing the constraints on the accuracy of the amplifier itself, as described herein in the context of an ADC system, although the techniques can be applied to other systems. In particular, the system includes a high accuracy attenuator having accuracy commensurate with the overall accuracy required of the system, and a low accuracy amplifier having accuracy which may be substantially less than the overall accuracy required of the system. The application of the same low accuracy amplifier to both signals of the input ratio relaxes the constraints upon its accuracy, while the high accuracy attenuator creates the accurate proportionality desired in the output signal ratio. This technique is described further with specific application to an ADC circuit.

The multistage ADC architecture described herein relaxes the requirement of gain accuracy in an interstage amplifier by time-multiplexing the amplifier to amplify a reference signal as well as the residue. The same amplifier gain applies to both signal and residue paths, and therefore is substantially irrelevant to the quantization in subsequent stages.

Figure 2:
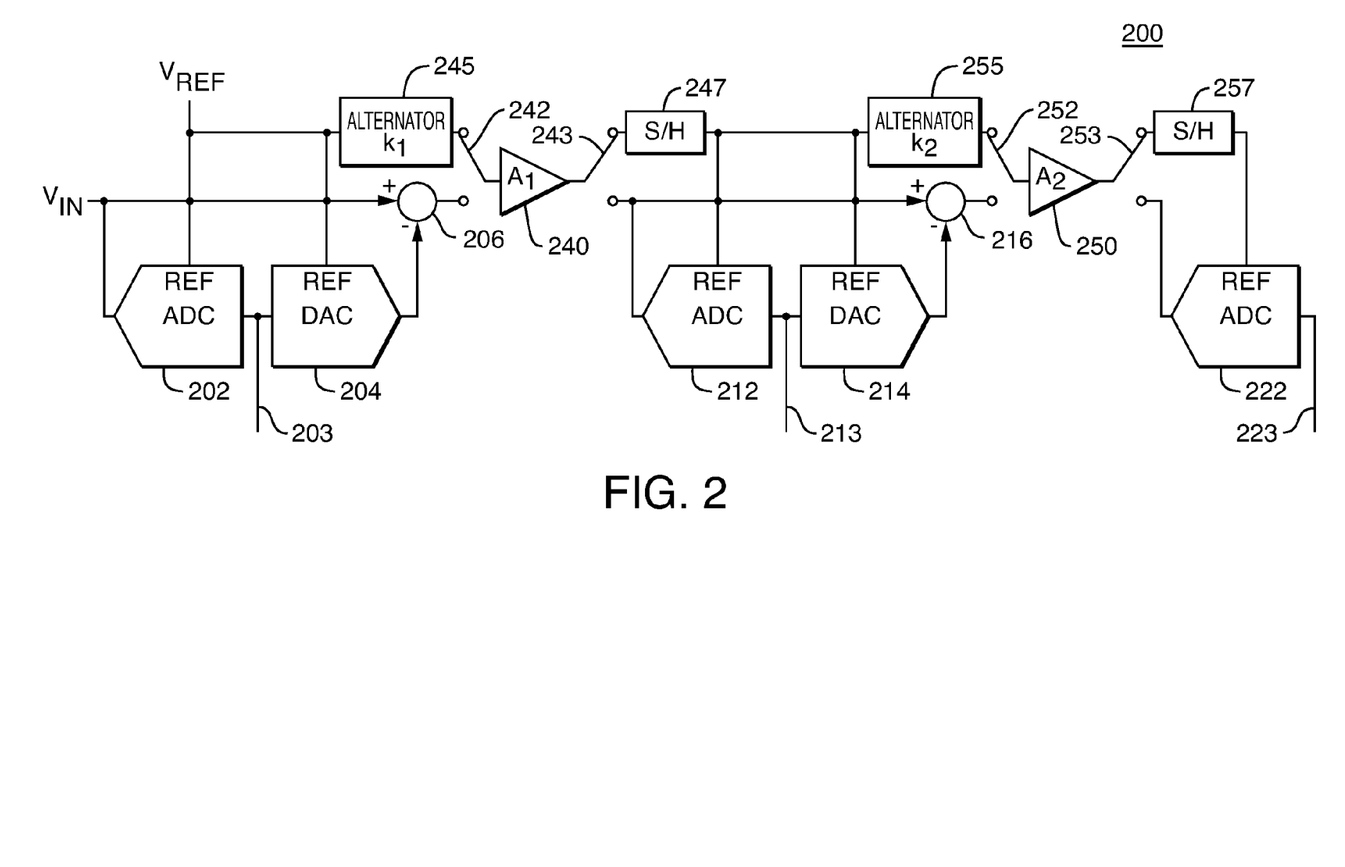
FIG. 2 is a block diagram of one embodiment of a multi-stage ADC architecture designed according to the teachings herein.

A block diagram of an ADC incorporating this technique is shown as 200 in FIG. 2. System 200 includes at least one interstage amplifier (shown between the first stage and second stage at 240), switches 242 and 243, attenuator 245, and sample-and-hold (S/H) circuit 247. In the embodiment shown the system 200 includes a second interstage amplifier 250, switches 252 and 253, attenuator 255, and sample-and-hold circuit 257. In addition, the connections to receive one or more reference signals are shown for ADCs 202, 212, 222, and DACs 204, 214.

The device operates in at least two alternating time periods, one for processing reference signal and one to process the residue signal. The operation is described with respect to elements 240-247 of the illustrated system 200 as follows. During a first (reference) time period, switch 242 is connected to the output of attenuator 245, and switch 243 is connected to the input of S/H circuit 247. S/H circuit 247 then samples and stores this signal, which is $k_1 A_1 V_{REF}$, where $k_1$ is the attenuation factor provided by attenuator 245, and $A_1$ is the gain of amplifier 240.

In the second (residue) time period or phase, switch 242 connects to the output of subtractor 206, and switch 243 connects to the inputs of ADC 212 and subtractor 216. During this time period, the conversion in the following stage is performed as usual, using the reference supplied by S/H circuit 247. The residue output of subtractor 206 is multiplied by the amplifier gain, producing an output of $A_1 V_{RES}$, where $V_{RES}$ is the output of subtractor 206. The quantization of ADC 212 is thus equivalent to $V_{RES}$ as a fraction of $k_1 V_{REF}$, substantially eliminating the accuracy effect of the amplifier gain. The attenuation factor $k_1$ is then chosen to set the relative scales of the two stages, including any error-correction range—extra range in the second stage quantization designed to account for transitory decision errors in the first stage—desired for the second or subsequent stage. Clearly, the accuracy concerns remain for the attenuation factor $k_1$, however it is much simpler to build an accurate high-speed attenuator (for example using a resistive or capacitive divider) than an accurate amplifier.

The gain $A_1$ of the amplifier still has effects on the system performance. The above analysis depends on gain Al being consistent, i.e., having the same value for both the reference time period and the residue time period. This typically means that the amplifier must have linearity characteristics commensurate with the accuracy required of the interstage amplifier it replaces. Additionally, if gain $A_1$ is a function of time and other factors (e.g. thermal effects), the two alternating time periods must occur such that the gain is the same for both (e.g. close together in time such that slow thermal effects are substantially the same and thus have no effect on the results)

The amplifier gain also still affects the absolute scale of the signals handled by later stages, and it therefore determines the impact of absolute error sources in those stages. If the gain is substantially too small, it will exacerbate the effects of noise and offset. Conversely, if the gain is too large, it may exceed the allowable operation range of the subsequent stage. Thus, it is still desirable to have somewhat controlled gain, but the level of gain accuracy required is much lower.

Figure 3:
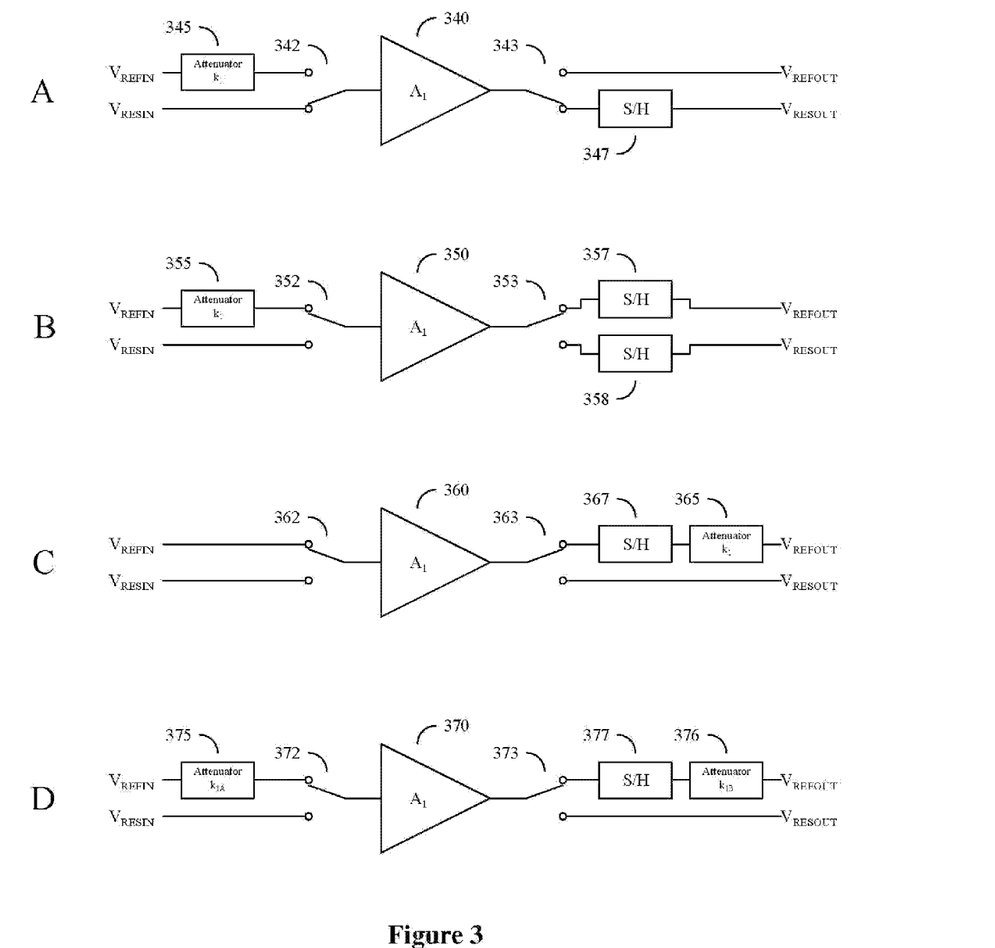
FIGS. 3A-3D illustrate various modifications that can be made to the embodiment shown in FIG. 2.

The disclosed system can be easily modified by employing alternative configurations of the amplifier, attenuator, S/H circuit, and switches, shown, for example, in FIG. 3. As shown in FIG. 3A, the first time period can be the residue time period for processing the residue signal, with the amplified residue being sampled by a S/H circuit 347, and the second-stage quantization can occur during the subsequent reference time period. FIG. 3B shows how S/H circuits 357 and 358 may be placed in both reference and residue paths to allow the converter to operate in a pipelined fashion.

The attenuation function may occur anywhere in the reference signal path depending on the desired performance characteristics of the system. As shown in FIG. 2, the necessary linear range of the amplifier is minimized since the reference signal presented to the amplifier is as small as possible. Alternately, as shown in FIG. 3C, the attenuation may be placed after the S/H circuit 367, or built into the S/H circuit block, which minimizes the effect of noise in amplifier 360 and the attenuator. Finally, it may be advantageous to split the attenuation into two blocks, as shown in FIG. 3D, one before the amplifier 370 as shown at 375 and one after the amplifier 370 as shown at 376. In such an arrangement the total attenuation $k_{1A}k_{1B}=k_1$. This allows almost all of the noise benefit to be gained, since even with only a small amount of signal attenuation by attenuator 376, the total noise effect of the reference path will be negligible, and maintaining most of the attenuation provided by attenuator 375 keeps the required linear range of amplifier 370 reasonably small.

As can be seen from the FIGS. 2 and 3A-3D, the system can employ low accuracy amplifiers and high accuracy attenuators. The term "high-accuracy" attenuator is an attenuator whose accuracy is substantially similar to the desired system accuracy, while the term "low-accuracy" amplifier is an amplifier whose accuracy may be substantially less than the desired system accuracy.

The representations shown in FIGS. 2 and 3A-3D are block diagrams which have been simplified in order to facilitate an explanation of the system. However, when implementing the system, the components of these block diagrams do not correspond one-to-one with circuit elements in a physical implementation. This is apparent in from a comparison of the block diagrams of FIGS. 2 and 3A-3D on the one hand, with the embodiment shown as circuit 500 in FIG. 4 on the other hand. The example of two stages of a multistage ADC shown in circuit 500 are a 10-bit charge-redistribution successive-approximation (SA) ADC, and a 3-bit flash ADC. The SA ADC comprises DAC capacitors 502-512, DAC switches 522-532, sampling and bias switches 520 and 521, and comparator 538, with additional offset capacitor 515 and switch 535. The flash ADC comprises resistor string 562 and comparator bank 565. The time-multiplexed amplifier function is accomplished with amplifier 540, capacitors 547 and 549, switches 548 and 550, buffer 560, and inverting buffer 561. The entire device is controlled by logic block 585.

Figure 4:
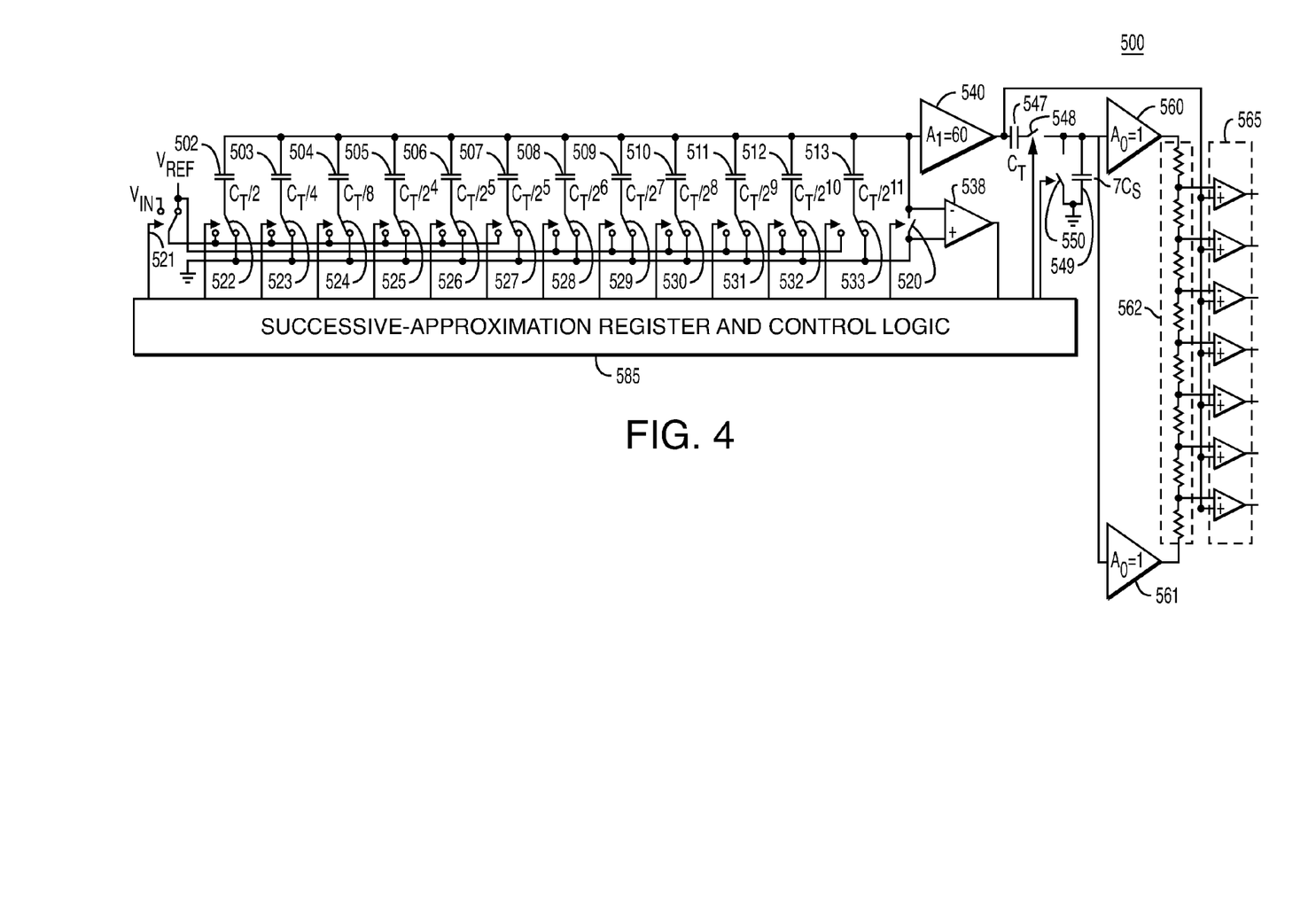
FIG. 4 is a more detailed illustration of one stage of the embodiment shown in FIG. 2.

The SA converter operates as is typical of a charge-redistribution SA ADC, converting the input sampled from $V_{IN}$. The conversion process includes an error-correction bit (the extra $C_T/2^5$ leg of capacitor 508 and switch 528) which can correct for transitory errors in earlier bit decisions. When the SA process is finished, an accurate residue (equivalent to the output of subtractor 206) is present at the input of amplifier 540.

The capacitors 502-512 and switches 522-532 additionally function as the attenuator required to produce the reference signal, as it inherently produces voltages which are attenuated versions of $V_{REF}$. Moreover, the successive approximation process provides a means of extracting this reference information without the need for additional processing time of a reference amplification step. In particular, in the illustrated example, the voltages present at the input of amplifier 540 directly before and after switch 529 is first switched by the SA process differ approximately by eight times (for three stages producing three bits) the range of residues which may ideally remain when the SA process completes. The function of the S/H circuitry therefore is to create and hold this difference, divided by 8, which produces a differential reference for the flash converter which is twice the expected range, giving an additional bit of error correction.

The specific operation of the attenuation and S/H circuitry illustrated in FIG. 4 is as follows. A first reference acquisition time period occurs during the bit test which determines the final state of switch 528. During this period, switches 548 and 550 are closed, imposing the voltage present at the output of amplifier 540 ($A_{vl} v_{DAC}$) onto capacitor 547. Before control logic 585 proceeds to the next bit test, switch 550 is opened, sampling that voltage onto capacitor 547, and providing zero volts on capacitor 549.

This begins the second reference acquisition period, and control logic 585 then switches 528 and 529 as appropriate, changing $$v_{DAC} \text{ by } \pm \frac{k_D V_{REF}}{2^7},$$

where $k_D \approx 1$ is the voltage attenuation factor at the DAC output due to total capacitive load, including parasitics. As a result, the voltage on capacitor 549 becomes $$\pm \frac{A_{vl} k_D V_{REF}}{2^{10}},$$

and switch 548 is opened by control logic 585 before the next bit test begins, holding this voltage on capacitor 549.

Finally, the SA process completes as normal, and switch 535 is switched on, centering the residue around zero, and leaving $v_{DAC}=k_D V_{RES}$, where the residue $V_{RES}$ would ideally (assuming no decision errors) lie in the range $$\pm \frac{V_{REF}}{2^{11}},$$

which when passed through amplifier 540 provides one bit of error correction range. Reconstruction of the overall 12-bit ADC output is based on the outputs of the comparator bank 565 and the decisions made by comparator 538 during the SA process, with accounting made for the polarity of the flash reference, as determined by the final state of switch 528.

In one representative example, the gain $A_{vl}$ of amplifier 540 is chosen to be approximately 60, as this makes the voltages output by amplifier 540 during the reference acquisition states similar in size to $V_{REF}$ itself, minimizing the noise effects of the flash converter and S/H circuitry without requiring an unreasonably large linear output range.

While this disclosure has been particularly shown and described with references to preferred embodiments thereof, it will be understood by those skilled in the art that various changes in form and details may be made therein without departing from the spirit and scope of the disclosure as defined by the following claims.

What is claimed is:

1. A system including a circuit receiving an input ratio represented by a first input signal and a second input signal, and producing an output ratio represented by a first output signal and a second output signal, the circuit comprising:
   a low accuracy amplifier and a high accuracy attenuator,
   during one time period the first input signal and the low accuracy amplifier are selectively coupled to produce the first output signal and during another time period the second input signal, the low accuracy amplifier and the high accuracy attenuator are selectively coupled to produce the second output signal;
   wherein the circuit maintains a highly accurate ratio between the output ratio and the input ratio.

2. The system according to claim 1, wherein the high accuracy attenuator is selectively coupled to the input of the low accuracy amplifier.

3. The system according to claim 1, wherein the high accuracy attenuator is selectively coupled to the output of the low accuracy amplifier.

4. The system according to claim 1, wherein the high accuracy attenuator comprises a first high accuracy attenuator circuit selectively coupled to the input of the low accuracy amplifier and a second high accuracy attenuator circuit selectively coupled to the output of the low accuracy amplifier circuit.

5. The system according to claim 1, wherein the first input signal is provided as the difference between input signals applied at least two distinct times.

6. The system according to claim 1, wherein the second input signal is provided as the difference between input signals applied at least two distinct times.

7. The system according to claim 1, further including storage circuitry operative to provide at substantially the same time output signals indicative of the first and second output signal of the circuit.

8. The system according to claim 7, wherein the storage circuitry produces output signals during a time period distinct from the time periods during which the first and second input signals are selectively coupled to the circuit.

9. The system according to claim 1, wherein the system operates to provide an analog-to-digital conversion function.

10. The system according to claim 9, wherein the system incorporates an analog-to-digital converter producing a digital output signal responsive to the output ratio of the circuit.

11. The system according to claim 10, wherein the analog-to-digital converter comprises a system constructed in accordance with claim 9.

12. The system according to claim 10, wherein the analog-to-digital converter incorporates a flash analog-to-digital converter.

13. The system according to claim 10, wherein the analog-to-digital converter operates in part by successive approximation.

14. The system according to claim 9, wherein the system incorporates an analog-to-digital-converter coupled to the input signals of the circuit.

15. The system according to claim 14, wherein the analog-to-digital converter incorporates a flash analog-to-digital converter.

16. The system according to claim 14, wherein the analog-to-digital converter operates in part by successive approximation.

17. An analog to digital conversion system including a multi-stage circuit comprising:
at least two stages each including a first signal path constructed to conduct at least a portion of an analog input signal, and a second signal path constructed to conduct at least a portion of an analog reference signal;
at least one amplifier having a gain, an input and an output; and
a time multiplexer constructed to operate alternately in at least two time periods, wherein
(a) during a first time period the first signal path of a first stage is connected to the input of the amplifier and the output of the amplifier is connected to the first signal path of a second stage, and
(b) during a second time period the second signal path of a first stage is connected to the input of the amplifier and the output of the amplifier is connected to the second signal path of the second stage, so that the analog input signal and analog reference signal are each amplified by the same gain as each is respectively transmitted from the first to the second stages during the first and second time periods.

18. A system according to claim 17, further including a signal attenuator for attenuating the analog reference signal in the second signal path of at least one of the stages.

19. A system according to claim 18, wherein the attenuator is disposed in the second signal path of the first stage.

20. A system according to claim 18, wherein the attenuator is disposed in the second signal path of the second stage.

21. A system according to claim 17, further including at least two signal attenuators for respectively attenuating the analog reference signal in the second signal path of the first and second stages.

22. A system according to claim 17, further including a sample and hold circuit constructed and arranged to sample and hold one of the analog signals in the second stage during one of the time periods so that it can be compared to the other of the analog signals in the next subsequent time period.

23. A system according to claim 22, wherein the sample and hold circuit is disposed in one of the signal paths of the second stage.

24. A system according to claim 23, wherein the sample and hold circuit is disposed in the second signal path of the second stage.

25. A system according to claim 23, wherein the sample and hold circuit is disposed in the first signal path of the second stage.

26. A system according to claim 17, further including at least two sample and hold circuits respectively disposed in the first and second signal paths of the second stage.

27. A system according to claim 17, wherein the first stage operates in part as a flash analog-to-digital converter.

28. A system according to claim 17, wherein the first stage operates in part by successive approximation.

29. A system according to claim 17, wherein the second stage operates in part as a flash analog-to-digital converter.

30. A system according to claim 17, wherein the second stage operates in part by successive approximation.

31. A system according to claim 17, wherein the first or second stage operates in part as a system constructed in accordance with claim 17.

32. A multi-stage analog to digital converter for converting an analog input signal to a digital output signal, comprising:
a plurality of stages constructed and arranged so as to quantize the analog input signal by comparing the input signal in the first stage and a residue signal in each subsequent stage with a reference signal provided to each stage, and an interstage amplifier disposed between each set of interconnected stages and operative so as to apply the same amplifier gain to the residue and reference signals provided to the subsequent stage.

33. A multi-stage analog-to-digital converter according to claim 32, further including a time-multiplexer constructed and arranged to multiplex each interstage amplifier so as to amplify each residue and each reference signal provided to each subsequent stage.

34. A multi-stage analog-to-digital converter according to claim 33, further including a signal attenuator constructed to attenuate the reference signal provided to each subsequent stage.

35. A multi-stage analog-to-digital converter according to claim 34, wherein the attenuator is constructed to attenuate the reference signal prior to being provided to the interstage amplifier.

36. A multi-stage analog-to-digital converter according to claim 34, wherein the attenuator is constructed to attenuate the reference signal subsequent to being provided to the interstage amplifier.

37. A multi-stage analog-to-digital converter according to claim 34, wherein the attenuator is constructed to attenuate the reference signal prior to and subsequent to being provided to the interstage amplifier.

38. A multi-stage analog-to-digital converter according to claim 33, wherein a sample and hold circuit is provided to sample and hold the residue signal in each subsequent stage.

39. A multi-stage analog-to-digital converter according to claim 33, wherein a sample and hold circuit is provided to sample and hold the reference signal of each subsequent stage.

40. A multi-stage analog-to-digital converter according to claim 33, wherein sample-and-hold circuits are provided to sample and hold the residue signal and reference signal of each subsequent stage.

41. A multi-stage analog-to-digital converter according to claim 32, wherein at least one of the plurality of stages operates as a flash analog-to-digital converter.

42. A multi-stage analog-to-digital converter according to claim 32, wherein at least one of the plurality of stages operates as a successive-approximation analog-to-digital converter.

43. A method of receiving an input ratio represented by a first input signal and a second input signal, and producing an output ratio represented by a first output signal and a second output signal, the method comprising:
alternately operating in at least two time periods, wherein in one time period the first input signal, a low accuracy amplifier, and the first output signal are selectively coupled, and in another time period the input signal, the low accuracy amplifier, a high accuracy attenuator, and the second output signal are selectively coupled so as to maintain the output ratio proportional to the input ratio.

44. A method according to claim 43, further including selectively coupling the high accuracy attenuator to the input of the low accuracy amplifier.

45. A method according to claim 43, further including selectively coupling the high accuracy attenuator to the output of the low accuracy amplifier.

46. A method according to claim 43, wherein the high accuracy attenuator comprises first and second high accuracy attenuator circuits, and the method further includes selectively coupling the first high accuracy attenuator circuit to the input of the low accuracy amplifier and selectively coupling the second high accuracy attenuator circuit to the output of the low accuracy amplifier circuit.

47. A method according to claim 43, further including providing the first input signal as the difference between input signals applied at least two distinct and different times.

48. A method according to claim 43, further including providing the second input signal as the difference between input signals applied at least two distinct and different times.

49. A method according to claim 43, further including operating storage circuitry so as to provide at substantially the same time output signals indicative of the first and second output signal.

50. A method according to claim 49, further including producing output signals during a time period distinct from the time periods during which the first and second input signals are selectively coupled.

51. A method according to claim 43, further including producing the input ratio and a digital output signal responsive to a third signal ratio.

52. A method according to claim 51, further including producing the digital output signal with a flash analog-to-digital conversion process.

53. A method according to claim 51, further including producing the digital output signal with a successive-approximation process.

54. A method according to claim 51, further including producing the input ratio from the third ratio by a method in accordance with claim 43.

55. A method according to claim 43, further including producing a digital output signal responsive to the output ratio.

56. A method according to claim 55, further including producing the digital output signal with a flash analog-to-digital conversion process.

57. A method according to claim 55, further including producing the digital output signal with a successive-approximation process.

58. A method according to claim 55, further including producing the input ratio from the third ratio by a method in accordance with claim 43.

59. A method of converting an analog input signal to a digital output signal, comprising:
operating a time multiplexer alternately in at least two time periods, wherein
(a) during a first time period connecting a first signal path of a first stage carrying an analog input signal to an input of an amplifier having a gain and connecting the output of the amplifier to a first signal path of a second stage, and
(b) during a second time period connecting a second signal path of the first stage carrying an analog reference signal to the input of the amplifier and connecting the output of the amplifier to a second signal path of the second stage;
wherein the analog input signal and analog reference signal are each amplified by the same gain as each is respectively transmitted from the first to the second stages during the first and second time periods.

60. A method according to claim 59, further including attenuating the analog reference signal in the second signal path of at least one of the stages.

61. A method according to claim 60, further including attenuating the analog reference signal in the second signal path of the first stage.

62. A method according to claim 60, further including attenuating the analog signal in the second signal path of the second stage.

63. A method according to claim 59, further including attenuating the analog reference signal in the second signal path of the first and second stages.

64. A method according to claim 59, further including sampling and holding one of the analog signals in the second stage during one of the time periods so that it can be compared to the other of the analog signals in the next subsequent time period.

65. A method according to claim 64, wherein sampling and holding one of the analog signals is performed in one of the signal paths of the second stage.

66. A method according to claim 64, wherein sampling and holding one of the analog signals is performed in the second signal path of the second stage.

67. A method according to claim 65, wherein sampling and holding one of the analog signals is performed in the first signal path of the second stage.

68. A method according to claim 59, wherein sampling and holding one of the analog signals is performed in both the first and second signal paths of the second stage.

69. A method according to claim 59, further including operating at least one of the first and second stages in part as a flash analog-to-digital converter.

70. A method according to claim 59, further including operating at least one of the first and second stages in part as a successive-approximation converter.

71. A method according to claim 59, further including operating at least one of the first and second stages in part by methods in accordance with claim 59.

72. A method of converting an analog input signal to a digital output signal using a plurality of stages and an interstage amplifier disposed between each successive stage, comprising:
  quantizing the analog input signal by comparing the input signal in the first stage and a residue signal in each subsequent stage with a reference signal provided to each stage, and
  applying the same amplifier gain to the residue and reference signals provided to the subsequent stage.

73. A method according to claim 72, time multiplexing each interstage amplifier so as to amplify each residue and each reference signal provided to each subsequent stage.

74. A method according claim 72, further including attenuating the reference signal provided to each subsequent stage.

75. A method according to claim 74, further including attenuating the reference signal prior to being provided to the interstage amplifier.

76. A method according to claim 74, further including attenuating the reference signal subsequent to being provided to the interstage amplifier.

77. A method according to claim 74, further including attenuate the reference signal prior to and subsequent to being provided to an interstage amplifier.

78. A method according to claim 72, further including sampling and holding the residue signal in each subsequent stage.

79. A method according to claim 72, further including sampling and holding the reference signal of each subsequent stage.

80. A method according to claim 72, further including sampling and holding the residue signal and reference signal of each subsequent stage.

81. A method according to claim 72, wherein the quantization in at least one of the plurality of stages is accomplished by a flash analog-to-digital conversion technique.

82. A method according to claim 72, wherein the quantization in at least one of the plurality of stages is accomplished by a successive-approximation technique.

* * * * *

UNITED STATES PATENT AND TRADEMARK OFFICE
CERTIFICATE OF CORRECTION

| | |
|---|---|
| PATENT NO. | : 8,018,370 B2 |
| APPLICATION NO. | : 12/698020 |
| DATED | : September 13, 2011 |
| INVENTOR(S) | : Thomas et al. |

It is certified that error appears in the above-identified patent and that said Letters Patent is hereby corrected as shown below:

The title page showing the illustrative figure should be deleted and replaced with the attached title page.

In the drawings, sheets 1 of 4, 2 of 4 and 4 of 4, consisting of figures 1, 2, and 4, should be deleted and replaced with the corrected figures 1, 2, and 4, as shown on the attached pages.

Signed and Sealed this
Twenty-ninth Day of May, 2012

David J. Kappos
*Director of the United States Patent and Trademark Office*

(12) United States Patent
Thomas et al.

(10) Patent No.: US 8,018,370 B2
(45) Date of Patent: Sep. 13, 2011

(54) TIME-MULTIPLEXED RESIDUE AMPLIFIER (75) Inventors: Andrew J. Thomas, Arlington, MA (US); Joseph L. Sousa, Lawrence, MA (US)

(73) Assignee: Linear Technology Corporation, Milpitas, CA (US)

( * ) Notice: Subject to any disclaimer, the term of this patent is extended or adjusted under 35 U.S.C. 154(b) by 23 days.

(21) Appl. No.: 12/698,020

(22) Filed: Feb. 1, 2010

(65) Prior Publication Data
US 2011/0187573 A1 Aug. 4, 2011

(51) Int. Cl.
*H03M 1/34* (2006.01)
(52) U.S. Cl. ........ 341/162; 341/118; 341/120; 341/155; 341/161; 341/163
(58) Field of Classification Search ......... 341/118–121, 341/155, 161, 162, 163
See application file for complete search history.

(56) References Cited

U.S. PATENT DOCUMENTS

| | | | | |
|---|---|---|---|---|
| 5,394,148 A * | 2/1995 | Matsuura et al. | | 341/162 |
| 6,028,546 A * | 2/2000 | Signell et al. | | 341/161 |
| 6,323,800 B1 * | 11/2001 | Chiang | | 341/161 |
| 6,369,744 B1 * | 4/2002 | Chuang | | 341/161 |
| 6,839,009 B1 * | 1/2005 | Ali | | 341/118 |
| 7,339,512 B2 * | 3/2008 | Gulati et al. | | 341/172 |
| 7,551,115 B2 * | 6/2009 | Bailey et al. | | 341/161 |
| 7,570,191 B2 * | 8/2009 | Easwaran et al. | | 341/161 |
| 7,623,057 B2 * | 11/2009 | Sakurai | | 341/172 |
| 7,652,601 B2 * | 1/2010 | Patterson et al. | | 341/136 |
| 7,663,516 B1 * | 2/2010 | Chandra | | 341/120 |
| 2005/0174277 A1 * | 8/2005 | Tani et al. | | 341/156 |

OTHER PUBLICATIONS

European Search Report issued in European Patent Application No. 11000785.3-1233, mailed Apr. 6, 2011.
Hatanaka, S., et al., "A Ratio-Independent Algorithmic Pipeline Analog-to-Digital Converter", Electronics, Circuits and Systems 2001 ICECS The 8th IEEE International Conference on Sep. 2-5, 2001, Piscataway, NJ, pp. 345-348, vol. 1, IEEE.

* cited by examiner

*Primary Examiner* — Linh V Nguyen
(74) *Attorney, Agent, or Firm* — McDermott Will & Emery LLP (57) ABSTRACT

A system is configured and a method is provided for receiving an input ratio represented by a first input signal and a second input signal, and producing an output ratio represented by a first output signal and a second output signal. The system is constructed and the method is provided for alternately operating in at least two time periods, wherein in one time period the first input signal, a low accuracy amplifier, and the first output signal are selectively coupled, and in another time period the input signal, the low accuracy amplifier, a high accuracy attenuator, and the second output signal are selectively coupled so as to maintain the output ratio proportional to the input ratio.

82 Claims, 4 Drawing Sheets